US008823679B2

(12) United States Patent
Inai

(10) Patent No.: US 8,823,679 B2
(45) Date of Patent: Sep. 2, 2014

(54) INPUT APPARATUS AND ELECTRONIC EQUIPMENT USING CAPACITIVE SENSING METHOD IN DETECTING OPERATIONS

(75) Inventor: Kento Inai, Zushi (JP)

(73) Assignee: Canon Kabushiki Kaisha (JP)

( * ) Notice: Subject to any disclaimer, the term of this patent is extended or adjusted under 35 U.S.C. 154(b) by 365 days.

(21) Appl. No.: 13/416,118

(22) Filed: Mar. 9, 2012

(65) Prior Publication Data

US 2012/0229150 A1   Sep. 13, 2012

(30) Foreign Application Priority Data

Mar. 10, 2011 (JP) ................................. 2011-052883

(51) Int. Cl.
*G06F 3/0362* (2013.01)
*G01R 27/26* (2006.01)
*G06F 3/044* (2006.01)
*H03K 17/96* (2006.01)
*G01D 5/24* (2006.01)

(52) U.S. Cl.
CPC ............ *G06F 3/0362* (2013.01); *H03K 17/962* (2013.01); *G01D 5/24* (2013.01); *G01R 27/2605* (2013.01); *G06F 3/044* (2013.01)
USPC ........................ 345/174; 178/18.06; 324/658

(58) Field of Classification Search
CPC ... G06F 3/0362; G06F 3/044; G01R 27/2605; G01D 5/24
See application file for complete search history.

(56) References Cited

U.S. PATENT DOCUMENTS

| 8,217,915 | B2* | 7/2012 | Philipp | 345/174 |
|---|---|---|---|---|
| 8,654,096 | B2* | 2/2014 | Yanase et al. | 345/174 |
| 2007/0291016 | A1* | 12/2007 | Philipp | 345/174 |
| 2012/0327013 | A1* | 12/2012 | Lee et al. | 345/174 |
| 2013/0027062 | A1* | 1/2013 | Inai | 324/679 |
| 2013/0076375 | A1* | 3/2013 | Hanumanthaiah et al. | 324/661 |
| 2013/0278538 | A1* | 10/2013 | Brunet et al. | 345/174 |
| 2014/0009428 | A1* | 1/2014 | Coulson et al. | 324/658 |
| 2014/0028570 | A1* | 1/2014 | Guard | 345/173 |
| 2014/0035859 | A1* | 2/2014 | Wilson et al. | 324/658 |
| 2014/0035871 | A1* | 2/2014 | Karpin et al. | 345/174 |
| 2014/0049505 | A1* | 2/2014 | Radivojevic et al. | 345/174 |

FOREIGN PATENT DOCUMENTS

| JP | 2001-296966 A | 10/2001 |
|---|---|---|
| JP | 2009-218785 A | 9/2009 |

* cited by examiner

*Primary Examiner* — Jermele M Hollington
(74) *Attorney, Agent, or Firm* — Rossi, Kimms & McDowell LLP

(57) ABSTRACT

An input apparatus capable of improving detection sensitivity in detecting operations using a capacitive sensing method. An operation member is operated to change the positional relationship between a substrate and a conducive member. In the conductive member, a first part whose facing area facing an earth electrode of the substrate does not change even when the positional relationship between the substrate and the conducive member changes, and second parts whore facing area facing detecting electrodes of the substrate changes in response to a change in the positional relationship between the substrate and the conducive member are formed. The substrate or the conducive member is formed so that when the facing area of the second parts facing the detecting electrodes reaches the maximum, the facing area of the second parts facing the detecting electrodes can be equal to the facing area of the first part facing the earth electrode.

7 Claims, 7 Drawing Sheets

INPUT APPARATUS AND ELECTRONIC EQUIPMENT USING CAPACITIVE SENSING METHOD IN DETECTING OPERATIONS

BACKGROUND OF THE INVENTION

1. Field of the Invention

The present invention relates to an input apparatus that uses a capacitive sensing method in detecting operations, and electronic equipment having the input apparatus.

2. Description of the Related Art

Conventionally, for digital equipment such as cellular phones, personal computers, car navigation systems, and digital cameras, techniques using a touch sensor or a touch panel as an input apparatus have come into widespread use. Examples of such input apparatuses include a capacitive type, a resistive type, and an optical type, and they have advantages and disadvantages and are used for a wide range of purposes. Among them, the capacitive type is excellent in detection accuracy and used for many devices. Some digital camera products equipped with touch panels using the capacitive sensing method have been released.

For input apparatuses using the capacitive sensing method, there are some detection methods, one of which detects the earth capacity of a human body, and this method has been used for many touch sensor ICs (integrated circuits). The ICs using this method are capable of detecting an electrical conductor with a ground potential approaching a sensor.

There are prior arts that apply this capacitive sensing type detection technique to a mechanical structure of an input apparatus (Japanese Laid-Open Patent Publication (Kokai) Nos. 2009-218785 and 2001-296966). First, Japanese Laid-Open Patent Publication (Kokai) No. 2009-218785 discloses the technique associated with a faucet device to detect the touch of a human finger or the like and continue an operating state even when a person moves the finger off the faucet device. When the touch of a human finger is detected using a touch sensor, and the faucet device is rotated, the rotating state of the faucet device can be detected and stored based on the position of an electrical conductor with a ground potential. By dynamically switching voltage applied to a sensor portion between a sensor detection potential and a ground potential, the rotating state can be detected with one sensor pattern.

Japanese Laid-Open Patent Publication (Kokai) No. 2001-296966 discloses a structure of a conductor which is incorporated in a rotating operation unit so as to improve resolution in rotation detection. In general, when the touch sensor technique is used for a rotating operation member, improvement of resolution in rotation detection can be realized by placing a number of sensor patterns. If this method is used, many touch sensor ICs may be required as the case may be, and this is not efficient. For this reason, according to Japanese Laid-Open Patent Publication (Kokai) No. 2001-296966, with attention focused only on detecting the direction of rotation, the number of types of sensors divided into blocks is three or more, and the sensors are arranged in order such that different types of sensors are adjacent to each other so that resolution in detecting the rotation of direction can be improved.

However, in the case where a plurality of types of sensors are used so as to improve detection resolution, the total area of each type of sensor patterns is small. Thus, the detection level of touch sensor ICs is relatively low. This tendency increases as the size of the rotating operation member decreases. In the future, a structure that optimizes (maximizes) the detection level of sensors as the size of the rotating operation member decreases so that the rotation of the rotating operation member can be efficiently detected at higher levels to improve detection sensitivity is desired.

SUMMARY OF THE INVENTION

The present invention provides an input apparatus capable of improving detection sensitivity in detecting operations using a capacitive sensing method, and electronic equipment having the input apparatus.

Accordingly, a first aspect of the present invention provides an input apparatus comprising a substrate configured to have an earth electrode and detecting electrodes formed thereon, a conductive member configured to be made of a conductive material, and an operation member configured to be operated to change a positional relationship between the substrate and the conducive member, wherein in the conductive member, a first part whose facing area facing the earth electrode does not change even when the positional relationship between the substrate and the conducive member changes, and second parts whore facing area facing the detecting electrodes changes in response to a change in the positional relationship between the substrate and the conducive member are formed, and the substrate or the conducive member is formed so that when the facing area of the second parts facing the detecting electrodes reaches the maximum, the facing area of the second parts facing the detecting electrodes can be substantially equal to the facing area of the first part facing the earth electrode.

Accordingly, a second aspect of the present invention provides an electronic equipment having an input apparatus as described above.

According to the present invention, detection sensitivity in detecting operations using a capacitive sensing method can be improved.

Further features of the present invention will become apparent from the following description of exemplary embodiments (with reference to the attached drawings).

DESCRIPTION OF THE EMBODIMENTS

The present invention will now be described in detail with reference to the drawings showing an embodiment thereof.

Figure 1:
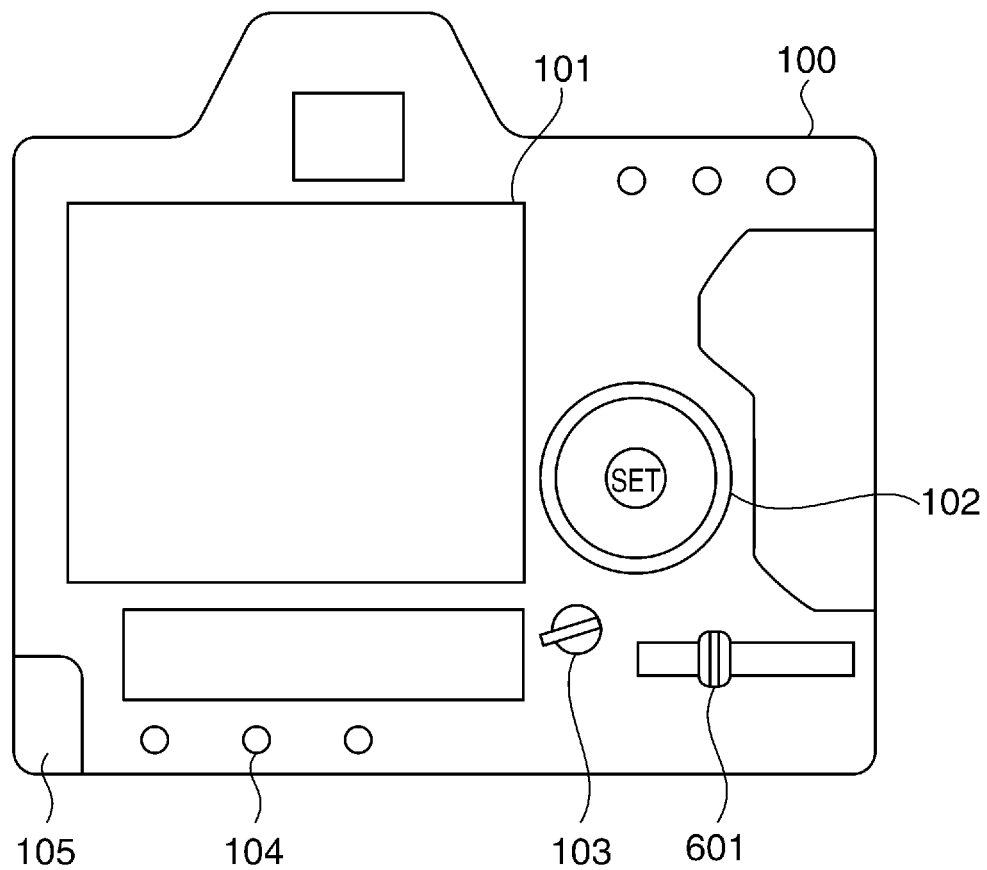
FIG. 1 is a rear view of electronic equipment to which an input apparatus according to an embodiment of the present invention is applied.

FIG. 1 is a rear view showing electronic equipment having an input apparatus according to an embodiment of the present invention. An image pickup apparatus 100 such as a digital camera is described as exemplary electronic equipment to which the input apparatus is applied, but the input apparatus may be applied to not only the image pickup apparatus 100 but also various types of electronic equipment. Two types of input apparatuses, that is, a rotary rotating operation unit 102 and a slidable slider 601 are described as exemplary input apparatuses, but the image pickup apparatus 100 may be provided with only one of these input apparatuses. The image pickup apparatus 100 is equipped with a display unit 101, a power-supply switch 103, operation buttons 104, a battery unit 105, and so on.

The rotating operation unit 102, the operation buttons 104, and the slider 601 are operation members that provide instructions on the operation of the image pickup apparatus 100. In the present embodiment, capacitive sensors are applied to the rotating operation unit 102 and the slider 601. First, a description will be given of an arrangement in a case where a capacitive sensor is applied to the rotating operation unit 102.

The display unit 101 is comprised of an LCD or the like, and displays an operating state, a message, and so on using characters, images, and so on according to an internal state of the image pickup apparatus 100. The power-supply switch 103 is a switch for turning on and off the power to the image pick apparatus 100. Turning off the power-supply switch 103 can disable, for example, the rotating operation unit 102, the operation buttons 104, and the slider 601, and this brings the image pick apparatus 100 into a low-power consumption state. The battery unit 105, which is a power source unit of the image pickup apparatus 100, is comprised of a primary battery such as an alkali battery or a lithium battery, a secondary battery such as a NiCd battery, a NiMH battery, or a Li battery, an AC adapter, or the like.

Figure 2A:
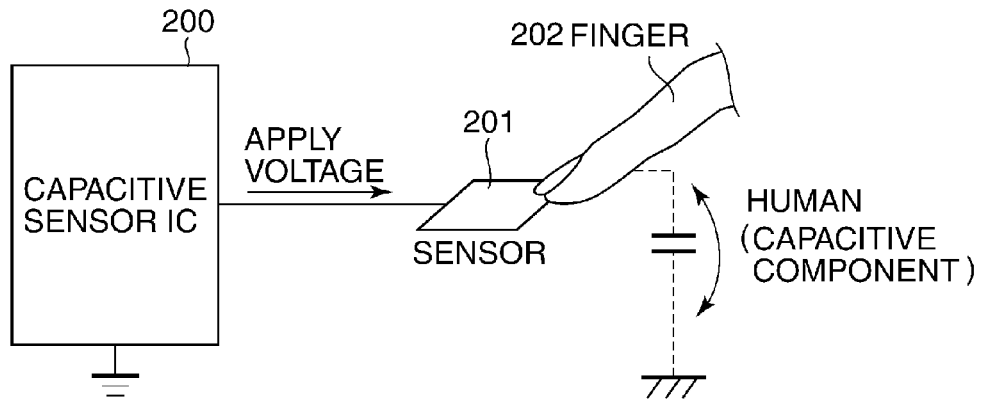
FIGS. 2A to 2C are schematic diagrams useful in explaining a capacitive touch sensor.
Figure 2B:
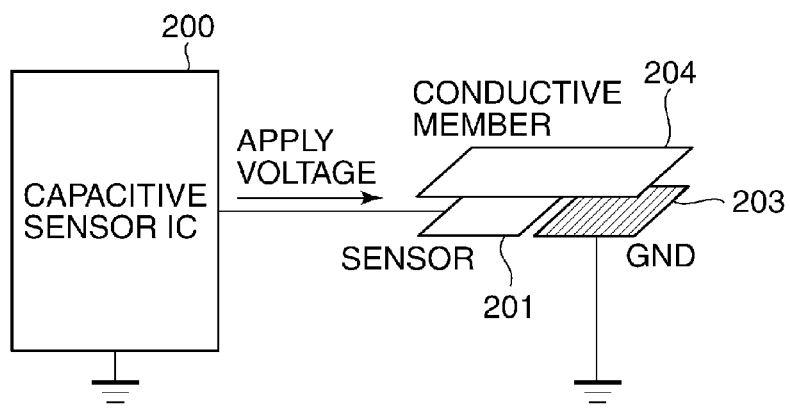
Figure 2C:
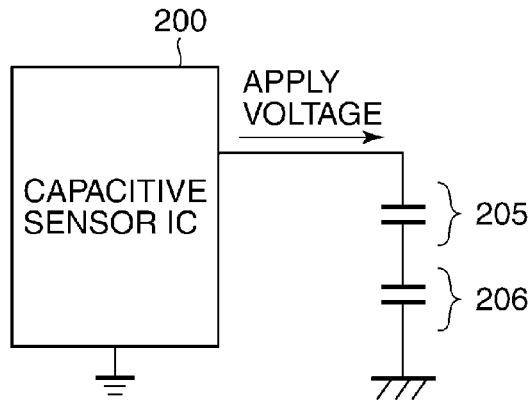

FIGS. 2A to 2C are schematic diagrams useful in explaining a capacitive touch sensor.

A plurality of detection methods have been devised for the capacitive touch sensor, and FIGS. 2A to 2C are useful in explaining how to detect the earth capacity of a human body. FIG. 2A shows a simplified arrangement of the capacitive touch sensor. A sensor pattern 201 is connected to a capacitive sensor IC 200, and voltage is applied to the sensor pattern 201 with predetermined timing. Because a human finger 202 has an earth capacity, the amount of electric charge accumulated on the sensor pattern 201 differs according to whether or not the human finger 202 touches the sensor pattern 201. By the sensor IC 200 detecting a difference in the amount of electric charge, whether or not the human finger 202 touches the sensor pattern 201 can be determined. The sensor IC 200 can not only detect the human finger 202 but also arbitrarily detect a change in earth capacity.

Accordingly, by placing a ground pattern 203 next to the sensor pattern 201, whether or not there is a conductive member 204 such as metal in opposed relation to upper parts of the sensor pattern 201 and the ground pattern 203 can be detected. An arrangement as shown in FIG. 2B can be equivalently (conceptually) perceived as a series circuit of capacitors as shown in FIG. 2C. Namely, opposing surfaces of the sensor pattern 201 and the conductive member 204 constitute a capacitor 205, and opposing surfaces of the conductive member 204 and the ground pattern 203 constitute a capacitor 206.

The capacity C1 of the capacitor 205 is represented by the following mathematical expression 1:

$$C1 = \in_1 \cdot S1/d1 \qquad \text{[Mathematical Expression 1]}$$

where the capacity of the capacitor 205 is C1, the area of parallel planes of respective electrodes of the capacitor 205 which face each other is S1, the distance between the parallel planes is d1, and the dielectric constant of substances between the parallel planes is $\in_1$.

Likewise, the capacity C2 of the capacitor 206 is represented by the following mathematical expression 2:

$$C2 = \in_2 \cdot S2/d2 \qquad \text{[Mathematical Expression 2]}$$

where the capacity of the capacitor 206 is C2, the area of parallel planes of respective electrodes of the capacitor 206 which face each other is S2, the distance between the parallel planes is d2, and the dielectric constant of substances between the parallel planes is $\in_2$.

The capacity Ctotal detected by the sensor IC 200 is represented by the following mathematical expression 3 because the capacity Ctotal is a capacity in the serial connection of the capacitors represented by the above mathematical expressions 1 and 2:

$$Ctotal = C1 \cdot C2/(C1+C2) = \in_1 \cdot \in_2 \cdot S1 \cdot S2/(\in_1 \cdot d2 \cdot S1 + \in_2 \cdot d1 \cdot S2) \qquad \text{[Mathematical Expression 3]}$$

Assuming that in the above mathematical expression 3, d1=d2 and $\in_1 = \in_2$ for the simplification of explanation, the capacity Ctotal represented by the following mathematical expression 4:

$$Ctotal = \in_1 \cdot S1 \cdot S2/d1(S1+S2) \qquad \text{[Mathematical Expression 4]}$$

As is clear from the above mathematical expression 4, the capacity Ctotal is the maximum when S1=S2, and at this time, the capacity Ctotal is represented by the following mathematical expression 5:

$$Ctotal = \in_1 \cdot S1 \cdot /(2 \cdot d1) \qquad \text{[Mathematical Expression 5]}$$

Based on this way of thinking, when a capacitive sensor is applied to the rotating operation unit 102 and the slider 601, detection sensitivity can be enhanced by maximizing one which corresponds to the capacity Ctotal. First, a description will be given of the rotating operation unit 102.

Figure 3:
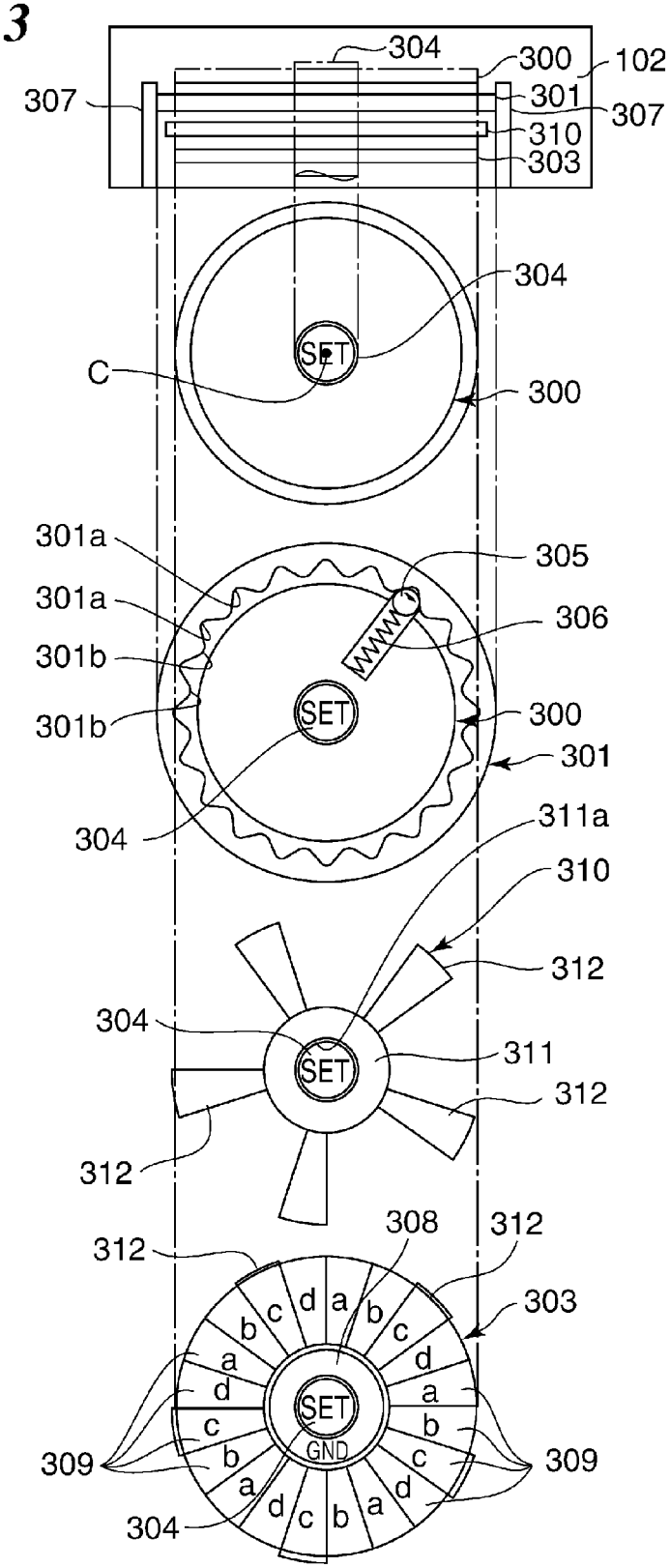
FIG. 3 is a diagram schematically showing an arrangement of a rotating operation unit.

FIG. 3 is a diagram schematically showing an arrangement of the rotating operation unit 102. The rotating operation unit 102 is comprised mainly of an operation member 300, a conductive member 310, a click portion (click unit) 301, a substrate 303, and a fixed portion 307. The fixed portion 307 is fixed to the image pickup apparatus 100. In the following description, a view of the rotating operation unit 102 seen from a rear face of the image pickup apparatus 100 is regarded as a frontal view of the rotation operation unit 102. In FIG. 3, a cross-sectional view of the rotation operation unit 102, a front view of the operation member 300, a front view of the click unit 301 and the operation member 300, a front view of the conductive member 310, and a front view of the substrate 303 are shown in this order from the top.

The operation member 300 is a ring-shaped member which is directly touched and operated by the user, and is rotatable about a rotation center C with respect to the fixed portion 307. A set button 304 is disposed at a center position of the operation member 300 in a radial direction. The set button 304 is used to, for example, rotate the operation member 300 to a desired position and determine an operation. The set button 304 penetrates the operation member 300, the conducive member 310, and the substrate 303. By depressing the set button 304, a push switch disposed in the fixed portion 307 is turned on.

In an outer portion of the operation member 300, a ball 305 is provided via a spring 306 in a manner externally projecting slightly from the operation member 300 in the radial direction. The spring 306 and the ball 305 rotate in conjunction with the operation member 300. Elasticity of the spring 306 enables the ball 305 to move in the radial direction of the operation member 300.

The click portion 301 is fixed to the fixed portion 307 and maintained fixed irrespective of whether or not the operation member 300 is rotated. The click portion 301 is ring-shaped, and has on an inner peripheral side thereof a concave-convex structure comprised of a repetition of concave portions 301a and convex portions 301b. When the operation member 300 rotates, the ball 305 is elastically fitted into the concave portion 301a, and at this position, goes into a tentative stable condition. When the ball 305 crosses the convex portion 301b against the repulsive force of the spring 306 and fits into the adjacent concave portion 301a, a click force is produced. The number of concave portions 301a (twenty) is the number of clicks per rotation. However, a structure for giving a click force to the operation member 300 is not limited to the structure illustrated here.

The conductive member 310 is made of a conductive material such as metal, and disposed so as to be rotatable with respect to the fixed portion 307 and about the rotation center C integrally with the operation member 300. In the conductive member 310, a ring-shaped ground facing portion 311 is formed around the set button 304. The ground facing portion 311 corresponds to a first part. The set button 304 passes through a hole 311a of the ground facing portion 311. A plurality of (five) blade-shaped sensor facing portions (second parts) 312 are radially extended from the ground facing portion 311. The sensor facing portions 312 correspond to second parts. The sensor facing portions 312 are provided at regular intervals in the direction of the circumference of a circle with the rotation center C at its center and have the same shape. The direction in which the operation member 300 and the conductive member 310 are movable is the direction of rotation about the rotation center C.

Figure 4:
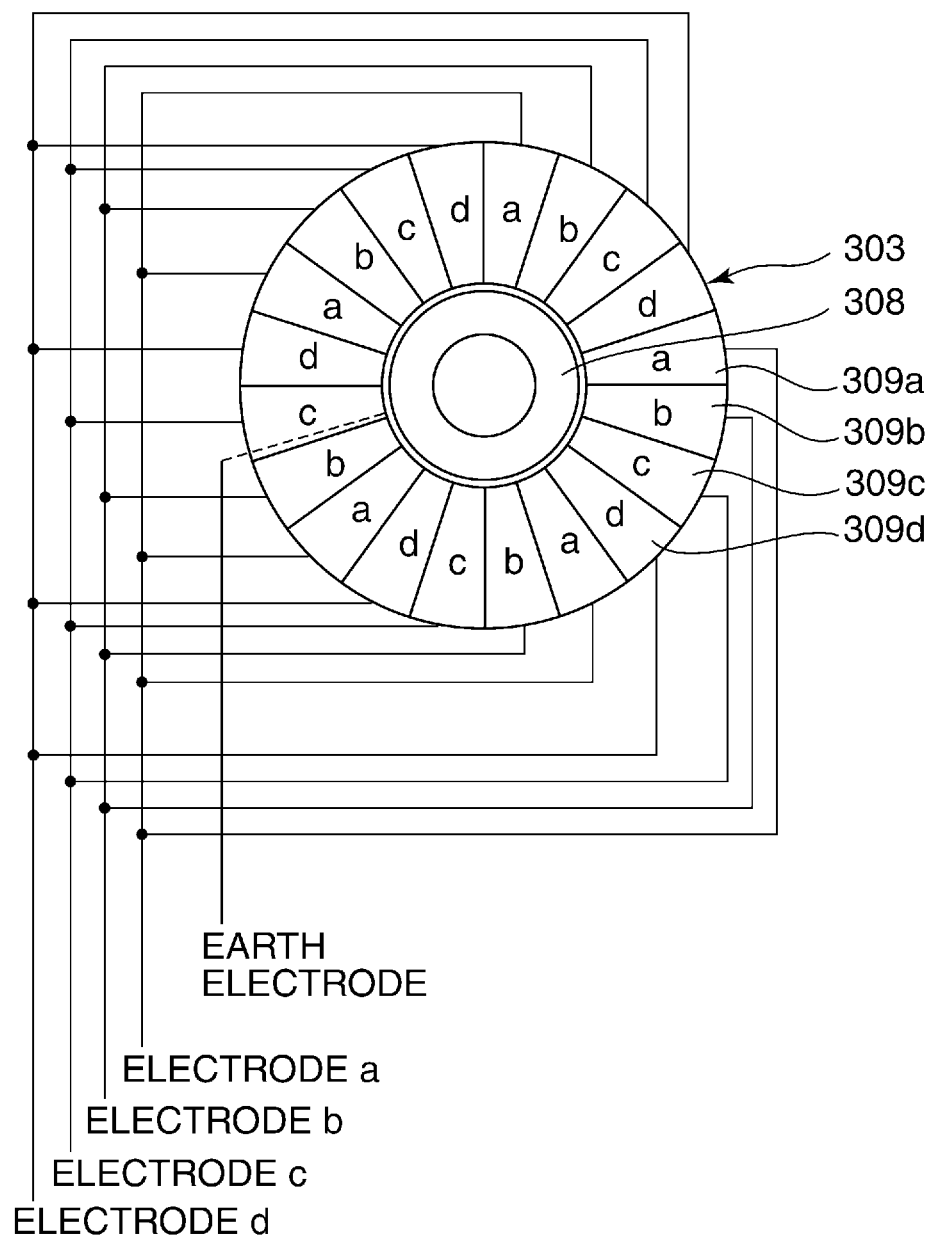
FIG. 4 is a view showing an exemplary layout of a substrate.

FIG. 4 is a diagram showing an exemplary layout of the substrate 303. The substrate 303 is fixed to the fixed portion 307. Because the set button 304 is disposed in the center of the substrate 303, the substrate 303 is doughnut-shaped. The shape of the substrate 303 is, however, not limited to this. The substrate 303 is a printed substrate on which a ground pattern 308 and sensor patterns 309 are disposed. The ground pattern 308 is placed in an inner peripheral portion of the substrate 303, and the sensor patterns 309 are placed outside the ground pattern 308 and in an outer peripheral portion of the substrate 303. The ground pattern 308 is an earth electrode that is grounded.

Here, the conductive member 310, the ground pattern 308, and the sensor patterns 309 according to the present embodiment correspond to the conductive member 204, the ground pattern 203, and the sensor patterns 201 described with reference to FIG. 2.

As shown in FIGS. 3 and 4, the ground pattern 308 corresponds to the ground facing portion 311 of the conductive member 310, and is shaped like a ring with the rotation center C at its center. The sensor patterns 309 are comprised of four types of detecting electrodes 309a, 309b, 309c, and 309d, and these four types of detecting electrodes are repeatedly placed five times at regular intervals within a range of 360 degrees. Thus, the detecting electrodes 309a, 309b, 309c, and 309d are placed in this order in a circumferential direction at intervals of 72 degrees. Here, different types of detecting electrodes have the same arrangement although terminals connected to them and signals output from them are different. Namely, a plurality of each type of detecting electrodes 309a, 309b, 309c, and 309d are formed in a direction in which the positional relationship between the substrate 303 and the conductive member 310 change. Here, the detecting electrode 309a corresponds to a first detecting electrode, the detecting electrode 309b corresponds to a second detecting electrode, and the detecting electrode 309c corresponds to a third detecting electrode.

A plurality of each type of detecting electrodes are arranged at regular angular intervals, which correspond to the intervals at which the sensor facing portions 312 are arranged. Thus, depending on rotational positions of the sensor facing portions 312, all the five sensor facing portions 312 cover over a certain type of five detecting electrodes (for example, the detecting electrodes 309a). In FIG. 3, the five sensor facing portions 312 face the five detecting electrodes 309c. Thus, the number of sensor facing portions 312 (in the present embodiment, five) is equal to the number of one type of detecting electrodes 309a, 309b, 309c, and 309d placed within the range of 360 degrees. The number of concave portions 301a and the intervals at which the concave portions 301a are formed in the click portion 301 coincide with the number of the detecting electrodes of the sensor pattern 309 and the intervals at which the detecting electrodes of the sensor pattern 309 are placed, and the positions of detecting electrodes are in a one-to-one correspondence with the twenty concaves and convexes. Thus, operation detections correspond to operation feelings in rotating operations. Namely, when the area of the five sensor facing portions 312 which faces any of the four types of detecting electrodes 309a, 309b, 309c, and 309d reaches the maximum, a click force for holding the operation member 300 is given to the operation member 300.

The sensor facing portions 312 face the sensor patterns 309 in parallel with them, and the ground facing portion 311 faces the ground pattern 308 in parallel with it. The distances between these facing parallel planes are uniform, and the dielectric constants of substances between the parallel planes are the same.

As shown in FIG. 4, the same type of the detecting electrodes of the sensor pattern 309 are joined together on the substrate 303 and connected to a sensor IC (not shown, but corresponding to the sensor IC 200 in FIG. 2). The four types of detecting electrodes 309a, 309b, 309c, and 309d are connected to the sensor IC via respective different terminals.

By the conductive member 310 rotating in a manner covering over the ground pattern 308 and the sensor patterns 309 on the substrate 303, the rotation of the operation member 300, and by extention the rotating operation unit 102 can be detected. When the conductive member 310 rotates in conjunction with the operation member 300, the ground facing portion 311 continuously faces the ground pattern 308, and the area of the ground facing portion 311 which faces the ground pattern 308 hardly changes. Thus, the capacitance between the ground facing portion 311 and the ground pattern 308 is maintained substantially constant.

On the other hand, when the conductive member 310 is rotating, (the detecting electrodes of) the sensor patterns 309 which the sensor facing portions 312 face gradually change, and when attention is focused on a certain type of detecting electrodes, a situation in which the sensor facing portions 312 do not face them at all, and a situation in which substantially the whole surfaces of the sensor facing portions 312 face them can occur. Namely, the capacitance between the sensor facing portions 312 and a certain type of detecting electrodes changes according to the rotational position of the conductive member 310. Based on a change in capacitance, a rotating motion of the operation member 300 is detected by the sensor IC. Also, because there are three or more types of detecting electrodes, and the types of detecting electrodes adjacent on both sides are different and all known, the rotating direction of operation member 300 can be grasped based on the order in which changes in capacitance occur.

Figure 5:
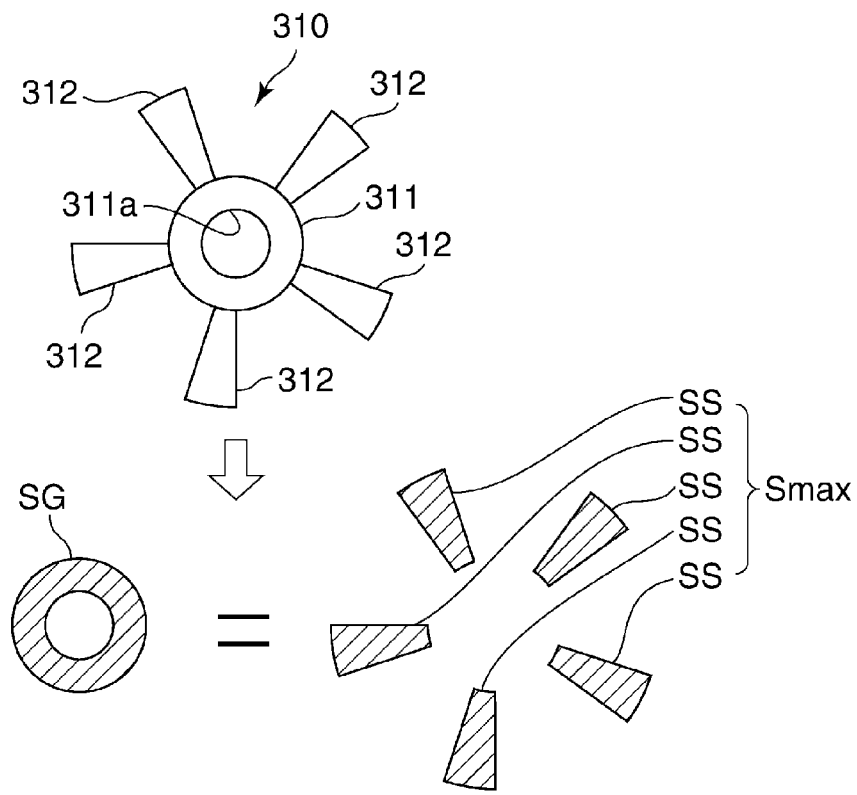
FIG. 5 is a view useful in explaining an area of a conductive member which faces a ground pattern and sensor patterns.

FIG. 5 is a diagram useful in explaining the area of the conductive member 310 which faces the ground pattern 308 and the sensor pattern 309.

As described above, the ground facing portion 311 of the conductive member 310 faces the ground pattern 308, and the facing area SG of the ground facing portion 311 which faces the ground pattern 308 is substantially constant irrespective of the rotational angle of the conductive member 310. The area of the sensor facing portions 312 which faces the sensor patterns 309 changes according to the rotational angle of the conductive member 310. For example, when the rotational positions of the five sensor facing portions 312 coincide with the five detecting electrodes 309a, and they face each other at the same time, the facing area reaches the maximum. The maximum value of the area of one sensor facing portion 312 which faces one detecting electrode is expressed by SS.

When the total area of a region in the conductive member 310 which faces the same type of detecting electrodes reaches the maximum, the maximum value of the total area is expressed by the maximum area Smax. The maximum area Smax is five times the maximum value SS. The same holds for all the types of detecting electrodes (309a to 309d).

In the present embodiment, the maximum area Smax is set to be substantially equal to the above-mentioned facing area SG of the conductive member 310 which faces the ground pattern 308. Most preferably, they are set to be equal. This is equivalent to S1=S2 in the common example shown in FIG. 2. As a result, the level at which a change in the capacitance between the conductive member 310 and the sensor pattern 309 is detected is maximized (optimized). Namely, the arrangement of sensor patterns is such that the detection level of the capacitive sensor is optimized (maximized), and detection sensitivity is enhanced.

According to the present embodiment, the total area of a region in the conductive member 310 which faces the sensor patterns 309 changes while the operation member 300 is moving. When the total area reaches the maximum area Smax, the maximum area Smax is substantially equal to the area of a region in the conductive member 310 which faces the ground pattern 308. As a result, even in a case where the rotating operation unit 102 is downsized, and accordingly, the sensor patterns 309 become reduced in size, detection levels can be obtained in an efficient manner, and sensor patterns of the capacitive sensor can be optimally configured. Thus, detection sensitivity in capacitive type operation detection can be enhanced.

Moreover, because the sensor patterns 309 include a plurality of types of detecting electrodes, and all the sensor facing portions 312 of the conductive member 310 face all the detecting electrodes of one type at the same time, resolution can be enhanced while detection sensitivity is maintained high.

Moreover, because in the direction in which the operation member 300 is movable, the positions in which the detecting electrodes of the sensor patterns 309 are arranged corresponds to positions at which click feelings are produced due to concaves and convexes of the click unit 301, operation feelings and operation detections can correspond to each other.

The layout of the substrate 303 is not limited to the illustrated one. Although in the present embodiment, the ground pattern 308 is disposed on the inner peripheral side of the substrate 303, and the sensor patterns 309 are disposed on the outer peripheral side of the substrate 303, this may be reversed. Specifically, one large ring-shaped ground pattern 308 may be provided on the outer peripheral side of the substrate 303, and a plurality of detecting electrodes of sensor patterns 309 may be arranged in a circumferential direction inside the ground pattern 308.

Moreover, although in the present embodiment, the number of clicks is twenty, there are four types (a, b, c, and d) of detecting electrodes of the sensor patterns 309, and the total number of sensor patterns is twenty, the numbers are not limited to this. In particular, the direction of rotation can be detected as long as there are at least three types of detecting electrodes.

Figure 6:
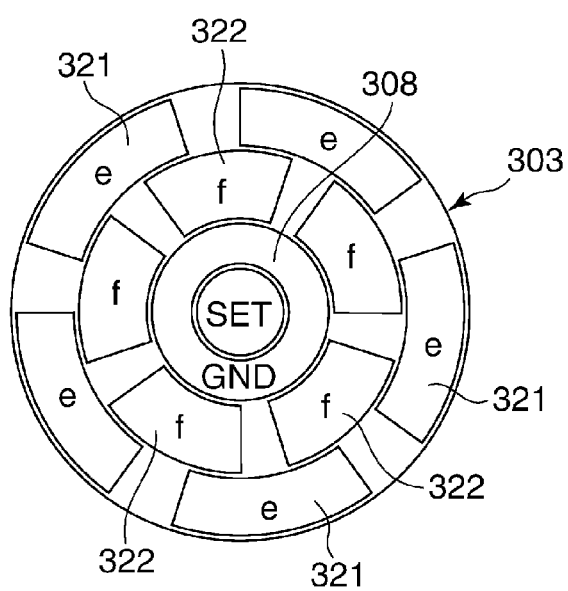
FIG. 6 is a view showing a layout of a substrate according to a variation.

Moreover, as in a variation shown in FIG. 6, there may be only two types of detecting electrodes. FIG. 6 is a view showing a layout of the substrate 303 according to the variation.

In this variation, as compared to the layout shown in FIG. 4, two types of sensor patterns 321 and 322 are provided in place of the sensor patterns 309. In the direction of the radius of the substrate 303, the sensor patterns 322 are disposed outside the ground pattern 308, and the sensor patterns 321 are disposed outside the sensor patterns 322. Specifically, detecting electrodes of the sensor patterns 321 and detecting electrodes of the sensor patterns 322 are formed in a staggered arrangement in a direction perpendicular to the direction in which the positional relationship between the substrate 303 and the conductive member 310 changes. The detecting electrodes of the sensor patterns 321 correspond to first detecting electrodes, and the detecting electrodes of the sensor patterns 322 correspond to second detecting electrodes.

Five sensor patterns 321 (e) and five sensor patterns 322 (f) are intermittently arranged at regular intervals in a circumferential direction. However, the sensor patterns 321 and the sensor patterns 322 are arranged at staggered positions in the circumferential direction, and namely, they are in a so-called staggered arrangement in which their phases are staggered a half cycle.

In this case, there are twenty positions at which any end of the sensor patterns 321 and 322 is positioned in the circumferential direction. Thus, detection with a resolution of 20 is possible. For twenty clicks, the total number of sensor patterns can be ten. Because the two types of detecting electrodes are thus disposed in a staggered arrangement in the direction in which the operation member 100 is movable, resolution can be enhanced with the two types of detecting electrodes.

Referring next to FIGS. 7A to 8B, a description will be given of an arrangement in a case where a capacitive sensor is applied to the slider 601.

Figure 7A:
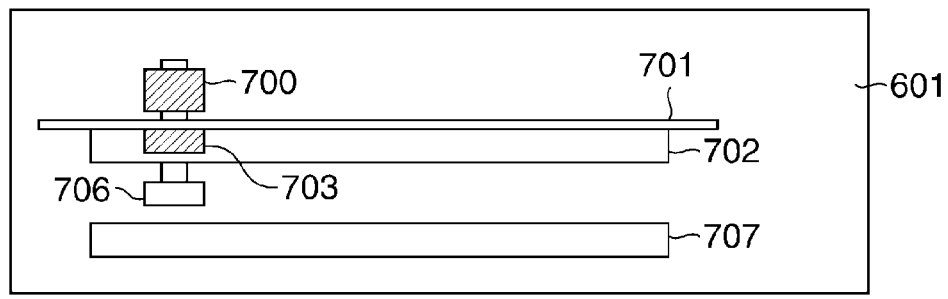
FIGS. 7A to 7C are diagrams schematically showing an arrangement of a slider that changes values in a digital fashion.
Figure 7B:
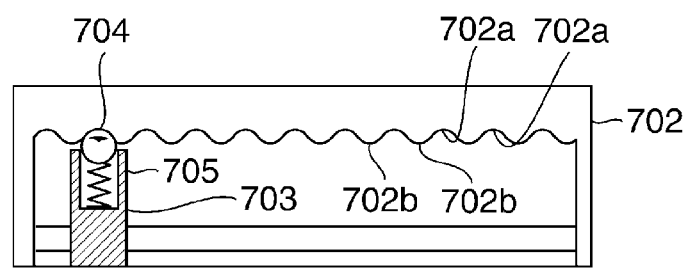
Figure 7C:
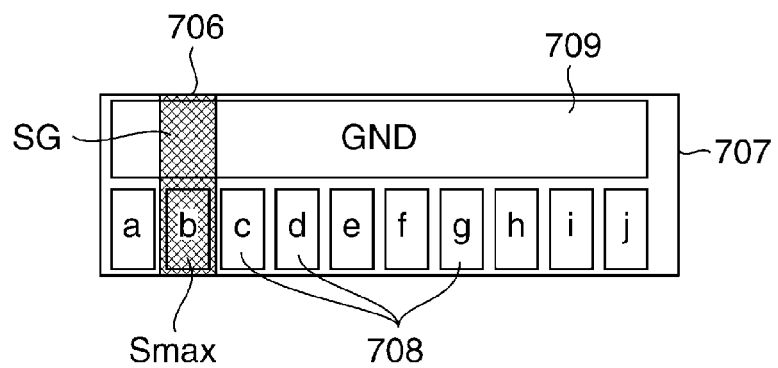

FIGS. 7A to 7C are diagrams schematically showing an arrangement of the slider 601. The slider 601 is a sliding operation member. FIGS. 7A to 7C illustrate an arrangement in which detection values change in a digital fashion, and a description will be given later of an arrangement in which detection values change in an analog fashion with reference to FIGS. 8A and 8B. Exemplary purposes of changing values in a digital fashion include operations such as switching of a power source between ON/OFF, switching of camera modes and switching of other operation members between ON/OFF. Exemplary purposes of changing values in an analogue fashion include operations such as speaker volume adjustment during reproduction of moving images, microphone volume adjustment during recording of moving images, brightness adjustment for the display unit 101, and parameter (such as color temperature) adjustment during shooting.

As shown in FIG. 7A, the slider 601 is comprised mainly of an operation member 700, a conductive member 706, a click portion 702, and a substrate 707, which correspond to the operation member 300, the conductive member 310, the click portion 301, and the substrate 303 of the rotating operation unit 102 (see FIG. 3). FIGS. 7A to 7C are a cross-sectional view of the slider 601, a front view of the click portion 702, and a front view of the substrate 707, respectively.

The operation member 700 is directly touched and operated by the user and linearly slidable in a horizontal direction as viewed in FIG. 7A with respect to a part 701 of a casing for the image pickup apparatus 100. The conductive member 706 is made of a conductive material such as metal, and slides integrally with the operation member 700. The click portion 702 is fixed to the part 701 of the casing and maintained fixed irrespective of whether or not the operation member 700 moves.

The operation member 700 is provided with an interlocked portion 703 sliding integrally with the operation member 700. As shown in FIG. 7B, the interlocked portion 703 has a spring 705 and a ball 704 which correspond to the spring 306 and the ball 305 of the rotating operation unit 102 (FIG. 3). The click portion 702 has a concave-convex structure comprised of a repetition of concave portions 702a and convex portions 702b which correspond to the concave portions 301a and the convex portions 301b of the rotating operation unit 102. The direction in which the concave-convex structure is formed is the same linear direction as the direction in which the operation member 700 is movable.

Similarly to the rotating operation unit 102, when the ball 704 crosses the convex portion 702b against repulsive force of the spring 705 and fits into the adjacent concave portion 702a, a click force of one click can be produced. However, a structure for giving a click force to rotation of the operation member 700 is not limited to the structure illustrated here.

As shown in FIG. 7C, the substrate 707 is a printed substrate on which a ground pattern 709 and sensor patterns 708 are disposed. The sensor patterns 708 are comprised of a plurality (ten types) of square detecting electrodes (a to j) are arranged in a row in the direction in which the operation member 700 is movable. The detecting electrodes (a to j) are uniform in size and shape, but terminals and output lines connected thereto are different. One ground pattern 709 is placed over the whole area where the detecting electrodes (a to j) are arranged in the direction in which the operation member 700 is movable, that is, the whole area of the movable range of the operation member 700. The conductive member 706 and the substrate 707 have a noncontact structure, and the conductive member 706 faces the ground pattern 709 and the sensor patterns 708 in parallel to them.

The concaves and convexes of the click portion 702 correspond to the number of detecting electrodes of the sensor patterns 708 (ten) and the intervals at which the detecting electrodes of the sensor patterns 708 are arranged. An area of the conductive member 706 which faces the ground pattern 709 corresponds to the ground facing portion 311 of the conductive member 310, and areas of the conductive member 706 which faces the sensor patterns 708 correspond to the sensor facing portions 312 of the conductive member 310 (see FIG. 3).

The capacitance between the conductive member 706 and a certain type of detecting electrodes of the sensor patterns 708 changes according to the sliding position of the conductive member 706. Based on a change in capacitance, a moving motion of the operation member 700 is detected by the sensor IC. Because there are three or more types of detecting electrodes, and types of detecting electrodes adjacent on both sides are different and all known, the direction in which the operation member 700 slides can also be grasped based on the order in which changes in capacitance occur. Otherwise, a basic arrangement is the same as that of the rotating operation unit 102.

While the operation member 700 is moving, the facing area SG of the conductive member 706 which faces the ground patterns 709 is -constant. On the other hand, when the position of the conductive member 706 in the direction in which the conductive member 706 moves coincides with the position of any detecting electrode of the sensor patterns 708, the facing area of the conductive member 706 which faces the sensor patterns 708 reaches the maximum. Thus, when the total area of the conductive member 706 which faces the sensor patterns 708 reaches the maximum, this maximum area Smax is substantially equal to the facing area SG.

Figure 8A:
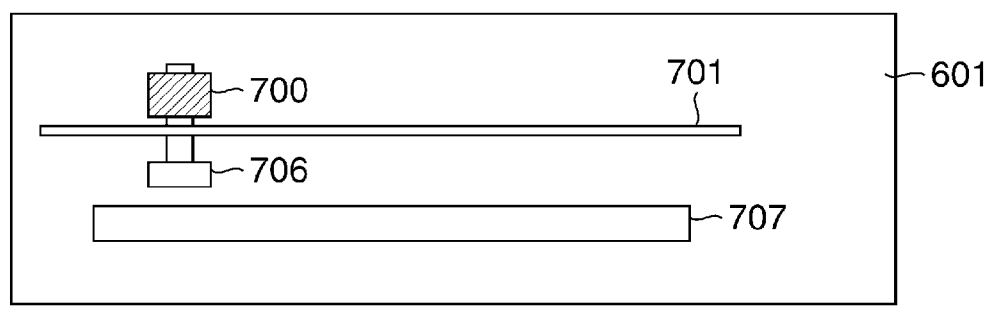
FIGS. 8A and 8B are diagrams schematically showing an arrangement of a slider that changes values in an analog fashion.
Figure 8B:
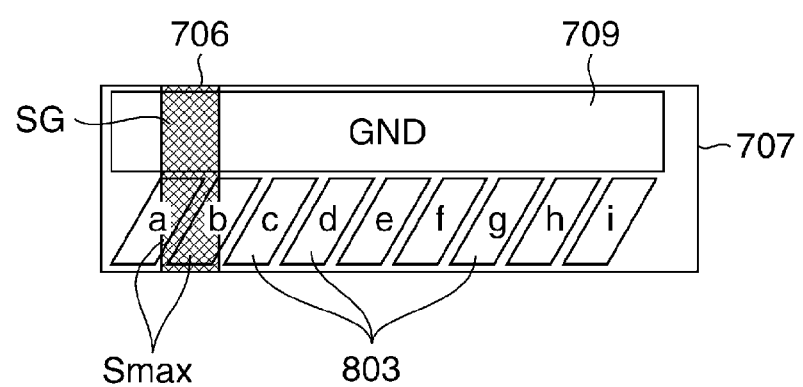

FIGS. 8A and 8B are views schematically showing an arrangement of the slider 601 which changes values in an analog fashion. The slider 601 shown in FIGS. 8A and 8B differs from the slider 601 shown in FIG. 7A in that the click portion 702 and the interlocked portion 703 are dispensed with, and sensor patterns disposed on the substrate 707 have a different shape, and otherwise, they have the same arrangement. FIGS. 8A and 8B are a cross-sectional view of the slider 601 and a front view of the substrate 707, respectively.

As shown in FIG. 8B, on the substrate 707, sensor patterns 803 are provided in place of the sensor patterns 708 in the example shown in FIGS. 7A to 7C. The sensor patterns 803 are comprised of a plurality (ten types) of detecting electrodes (a to j) arranged in a row in the direction in which the operation member 700 is movable. The detecting electrodes (a to j) are parallelograms and configured such that adjacent ones overlap in the direction in which the operation member 700 is movable.

Detection levels obtained from the respective detecting electrodes of the sensor patterns 803 are changed in an analog fashion by sliding the operation member 700. Thus, the direction in which the operation member 700 moves and the position at which the operation member 700 lies can be detected.

In the stroke of the operation member 700, the facing area SG of the conductive member 706 which faces the ground patterns 709 is constant. On the other hand, depending on the shapes of and the gaps between the detecting electrodes of the sensor patterns 803, when the total area of a region in the conductive member 706 which faces the sensor patterns 803 reaches the maximum, this is regarded as the maximum area Smax. As far as the example shown in FIGS. 8A and 8B is concerned, the area of the conductive member 706 which faces the sensor patterns 803 is uniform and also the maximum at any position of the conductive member 706. The maximum area Smax is set to be substantially equal to the facing area SG.

Detection sensitivity in capacitive type operation detection can be enhanced even for the slider 601 whose operation member 700 is linearly movable as in the arrangements shown in FIGS. 7A to 7C and FIGS. 8A and 8B.

It should be noted that in the examples shown in FIGS. 7A to 7C and FIGS. 8A and 8B, it is only necessary that the number of types of detecting electrodes of the sensor patterns 708 and 803 be three or more, and they be arranged in a predetermined order in the direction in which the operation member 700 is movable from the viewpoint of making it possible to detect the direction in which the operation member 700 moves. Moreover, the conductive member 706 may be provided with a plurality of sensor facing portions which face the same type of detecting electrodes at the same time as is the case with the sensor facing portions 312 of the conductive member 310 (FIG. 4).

It should be noted that the substrate layout shown in FIG. 6 may be applied to the examples shown in FIGS. 7A to 7C and FIGS. 8A and 8B, and two types of detecting electrodes of sensor patterns may be in a staggered arrangement in a linear direction.

It should be noted that although in the examples described above, the operation members (300 and 700) are movable in the rotational direction and the linear direction, this is not limitative. The operation members may be configured to go and return on or go around a nonlinear route such as a curved arc, and a plurality of detecting electrodes of sensor patterns may be arranged in the direction in which the operation members are movable. Moreover, the operation members may be operated in such directions as to be pushed and pulled.

It should be noted that although in the examples described above, the operation members 300 and 700 are movable, and the substrates 303 and 707 are fixed, the operation members 300 and 700 may be configured to be displaced relatively to the substrates 303 and 707.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-052883 filed Mar. 10, 2011, which is hereby incorporated by reference herein in its entirety.

What is claimed is:

1. An input apparatus comprising:
a substrate configured to have an earth electrode and detecting electrodes formed thereon;
a conductive member configured to be made of a conductive material; and
an operation member configured to be operated to change a positional relationship between said substrate and said conducive member,
wherein in said conductive member, a first part whose facing area facing the earth electrode does not change even when the positional relationship between said substrate and said conducive member changes, and second parts where facing area facing the detecting electrodes changes in response to a change in the positional relationship between said substrate and said conducive member are formed, and
said substrate or said conducive member is formed so that when the facing area of the second parts facing the detecting electrodes reaches the maximum, the facing area of the second parts facing the detecting electrodes can be equal to the facing area of the first part facing the earth electrode.

2. An input apparatus according to claim 1, wherein
on said substrate, a plurality of detecting electrodes are formed in a direction in which the positional relationship between said substrate and said conducive member changes, and
in said conductive member, the second parts corresponding in number to the number of detecting electrodes are formed in the direction in which the positional relationship between said substrate and said conducive member changes.

3. An input apparatus according to claim 1, wherein
the detecting electrodes comprise a first detecting electrode, a second detecting electrode, and a third detecting electrode that output respective different signals,
on said substrate, the first detecting electrode, the second detecting electrode, and the third detecting electrode are formed in this order in the direction in which the positional relationship between said substrate and said conducive member changes.

4. An input apparatus according to claim 1, wherein
the detecting electrodes comprise a first detecting electrode and a second detecting electrode that outputs signals different from signals output from the first detecting electrode, and
on said substrate, the first detecting electrode and the second detecting electrode are formed in a staggered arrangement in a direction perpendicular to the direction in which the positional relationship between said substrate and said conducive member changes.

5. An input apparatus according to claim 3, wherein
on said substrate, a plurality of first detecting electrodes are formed in the direction in which the positional relationship between said substrate and said conducive member changes, and the second detecting electrodes corresponding in number to the number of first detecting electrodes are formed in the direction in which the positional relationship between said substrate and said conducive member changes, and
in said conductive member, the second parts corresponding in number to the number of first detecting electrodes are formed in the direction in which the positional relationship between said substrate and said conducive member changes.

6. An input apparatus according to claim 1, further comprising a click unit configured to give a click force to said operation member,
wherein when the facing area of the second parts facing the detecting electrodes reaches the maximum, said click unit gives a click force for holding said operation member to said operation member.

7. An electronic equipment having an input apparatus according to claim 1.

* * * * *